United States Patent [19]
Takei et al.

[11] Patent Number: 5,106,470
[45] Date of Patent: Apr. 21, 1992

[54] METHOD AND DEVICE FOR CONTROLLING AN ELECTROMAGNET FOR A MAGNETRON SPUTTERING SOURCE

[75] Inventors: Hiromichi Takei, Chigasaki; Hidenori Suwa, Zushi; Shinichi Ono, Chigasaki; Osamu Tsukakoshi, Hiratsuka, all of Japan

[73] Assignee: Nihon Shinku Gijutsu Kabushi Kaisha, Chigasaki, Japan

[21] Appl. No.: 498,151

[22] Filed: Mar. 14, 1990

[30] Foreign Application Priority Data

Mar. 15, 1989 [JP] Japan .................................. 1-62662

[51] Int. Cl.$^5$ .............................................. C23C 14/35
[52] U.S. Cl. ............................. 204/192.12; 204/298.2
[58] Field of Search ..................... 204/192.12, 298.2

[56] References Cited

U.S. PATENT DOCUMENTS

| | | | |
|---|---|---|---|
| 3,956,093 | 5/1976 | McLeod | 204/192.12 |
| 4,401,539 | 8/1983 | Abe et al. | 204/192.13 |
| 4,572,776 | 2/1986 | Aichert et al. | 204/298.09 |
| 4,865,710 | 9/1989 | Aaron et al. | 204/192.12 |

FOREIGN PATENT DOCUMENTS

330445A1 8/1989 European Pat. Off. .
4000941A1 8/1990 Fed. Rep. of Germany .

*Primary Examiner*—Aaron Weisstuch
*Attorney, Agent, or Firm*—Armstrong, Nikaido, Marmelstein, Kubovcik & Murray

[57] ABSTRACT

An apparatus and method for controlling an electromagnet for a magnetron sputtering source controls electric currents flowing through a central coil and an inner peripheral coil of the electromagnet to flow in the same direction. Further, the direction of the electric current flowing through an outer peripheral coil is made to flow in the same direction as, and in the opposite direction to, the electric currents through the central coil and the inner peripheral coil. Therefore, the magnetic field to be generated in a space near the surface of the target moves between the central portion and the peripheral portion thereof each time the direction of the electric current flowing through the outer peripheral coil is reversed. Since the of high density plasma also moves in accordance with the magnetic field, the area of the target which is sputtered becomes wider and the efficiency of utilization of the target is improved.

6 Claims, 6 Drawing Sheets

METHOD AND DEVICE FOR CONTROLLING AN ELECTROMAGNET FOR A MAGNETRON SPUTTERING SOURCE

BACKGROUND OF THE INVENTION

This invention relates to a method and device for controlling a magnetic field of an electromagnet for a magnetron sputtering source.

A conventional magnetron sputtering apparatus is shown in FIG. 11. The apparatus shown in the figure is explained hereinbelow. The reference numeral 20 denotes a vacuum chamber in which are provided a gas introduction port 21 for introducing support gas (e.g., argon gas) and a gas exhaust port 22 to which a vacuum pump is connected for evacuating the vacuum chamber 20. In the interior of the vacuum chamber 20, there are opposingly provided an anode 24 on which substrates 23 are mounted, and a magnetron sputtering source 25. The magnetron sputtering source 25 is provided with an electromagnet 28 on the rear surface of a target 29, which also serves as a cathode. The electromagnet 28 comprises a central yoke 26b projecting upwards from the center of a plate-shaped bottom yoke 26a which is made of a ferromagnetic material of a wall-shaped peripheral yoke 26c projecting upwards from the periphery of the bottom yoke 26a and circularly enclosing the central yoke 26b, a central coil 27a wound around the central yoke 26b, an inner peripheral coil 27b wound around the inner periphery of the peripheral yoke 26c on the side of the central yoke 26b, and an outer peripheral coil 27c wound around the outer periphery of the peripheral yoke 26c.

The central coil 27a is formed by winding its coil around the central yoke 26b in the circumferential direction. The inner peripheral coil 27b and the outer peripheral coil 27c are formed by winding their coils around the peripheral yoke 26c in the circumferential direction.

In this sputtering apparatus, the vacuum chamber 20 is evacuated and then argon gas, for example, is introduced thereinto. Each of the coils 27a, 27b, 27c is charged with an electric current. At the same time, the target 29 is charged with an electric current, thereby starting the sputtering operation. With electric current flowing through each of the coils, the electromagnet 28 generates arched lines 30 of magnetic force which originate from the peripheral yoke 26c towards the central yoke 26b. Through the operation of the lines of magnetic force, the electrons generated by the electric discharge are restricted between the anode 24 and the target 29 to a space enclosed by the lines 30 of magnetic force and the target 29. The electrons collide with the molecules of the argon gas while making a cycloidal movement. The electrons will excite or ionize the argon gas, and thus generate plasma of high density in the space. Then, the ions in the plasma sputter the target 29 which is the cathode, and those particles of the target 29 which are generated by sputtering are caused to adhere to the substrates 23 to form thin films thereon.

Electric current is so controlled that constant amounts of current are made to flow in the same direction through the central coil 27a and the inner peripheral coil 27b, and that a constant amount of electric current is made to flow in a predetermined direction through the outer peripheral coil 27c.

In the conventional method of controlling the electromagnet for a magnetron sputtering source, as described above, constant amounts of electric current are controlled to flow through the central coil 27a and the inner peripheral coil in the same direction and a constant amount of electric current is made to flow through the outer peripheral coil 27c in a predetermined direction, and the shape of the arched lines 30 of magnetic force generated near the surface of the target 29 undergoes little or no change. Therefore, a plasma of high density concentrates on a spot where the lines 30 of magnetic force become parallel to the target 29, and that a small portion of the target which corresponds to the spot in question becomes eroded, resulting in disadvantages in that a wide area of the target 29 cannot be uniformly sputtered and that the utilization of the target 29 is poor.

SUMMARY OF THE INVENTION

According to this invention, electric currents of the same direction ar made to flow through the central coil and the inner peripheral coil of the electromagnet for the magnetron sputtering source, and the electric current flowing through the external peripheral coil is made to flow in the same direction as, and in the opposite direction to, the electric currents through the central coil and the inner peripheral coil. Therefore, the magnetic field to be generated in a space near the surface of the target moves between the central portion and the peripheral portion each time the direction of the electric current flowing through the external peripheral coil is reversed. Since the plasma of high density also moves in accordance with this movement, that area of the target which is sputtered becomes wider and the efficiency of utilization of the target is improved.

After a vacuum is created in the vacuum chamber, an inert gas such as argon gas or the like is introduced. An electric potential difference is generated between the anode on which the substrates are mounted and the magnetron sputtering source which is provided opposite to the anode. The electromagnet which is provided to the rear of the target of the magnetron sputtering source is charged with electricity. Then, plasma discharge occurs between the anode and the target. The electrons in the plasma are constrained by those arched lines of magnetic force near the surface of the target which are generated by the electromagnet, thereby forming a plasma of high density in the space enclosed by the lines of magnetic force and the target. This operation is the same as that in the conventional magnetron sputtering apparatus, i.e., the plasma of high density activate collisions between the molecules of the inert gas and the electrons to generate many ions, and the collision of many ions against the target causes many particles of the target to be ejected towards the substrates, thereby forming thin films on the surfaces of the substrates at a relatively high speed.

In this invention, the electric currents in the same direction are controlled to flow respectively through the central coil and the inner peripheral coil of the electromagnet, and the electric current which is opposite in direction to those through the central coil and the inner peripheral coil is caused to flow periodically through the outer peripheral coil. By this control, the arching of those lines of magnetic force which are generated near the surface of the target varies. A spot with a strong magnetic field reciprocally moves between a part nearer the center and a part nearer the periphery of the target. As a result of this movement, a place in which the plasma of high density is generated moves reciprocally between the part nearer the center and the part nearer the periphery. Consequently, the portion in which the target is eroded by sputtering becomes wider, and the efficiency of utilization of the target increases.

If the value of the electric current flowing through the outer peripheral coil is controlled between large and small values along with the control of the flow direction of the electric current in the electromagnet, the strength of the magnetic field to be generated by the outer peripheral coil varies between strong and weak. As a result, the spot with a strong magnetic field starts oscillating between the part nearer the center and the part nearer the periphery. Along with this oscillation, the place in which the plasma of high density is generated also oscillates, and that area of the target which is sputtered increases by the width of the oscillation, resulting in a higher efficiency of utilization of the target.

A first object of this invention is to improve the efficiency of utilization of the target which is used in the magnetron sputtering, and a second object is to provide a method and device for controlling the magnetic field of an electromagnet which is suitable for increasing the efficiency of utilization of the target.

In order to attain the above-mentioned objects, this invention is characterized by a method of controlling an electromagnet for a magnetron sputtering source. The electromagnet is disposed on a rear surface of a target, and comprises a central yoke projecting upwards from a central portion of a bottom yoke, a circular peripheral yoke projecting upwards from the periphery of the bottom yoke, a central coil wound around the central yoke in the circumferential direction thereof, an inner peripheral coil wound around the internal periphery of the periphery yoke in the circumferential direction thereof on the side of the central and an external peripheral coil wound around the outer periphery of the peripheral yoke in the circumferential direction thereof, whereby a magnetic field is formed in a space near the surface of the target by electric current flow through each of the coils. In this structure, the directions of electric currents flowing through the central coil and the inner peripheral coil are made to be identical. In addition, the direction of an electric current flowing through the outer peripheral coil is periodically controlled in the same direction as, and in the opposite direction to, those of the electric currents flowing through the central coil and the inner peripheral coil.

In the above-mentioned control method and device, it is preferable to periodically change the direction of the electric current to flow through the outer peripheral coil in the opposite direction and, at the same time, to change the value of the electric current between large and small values.

BRIEF DESCRIPTION OF THE DRAWINGS

The advantages of the invention will become apparent in the following description taken in conjunction with the drawings, wherein.

DETAILED DESCRIPTION OF THE PREFERRED EMBODIMENTS

Preferable embodiments of this invention are explained hereinbelow with reference to the drawings.

Figure 1:
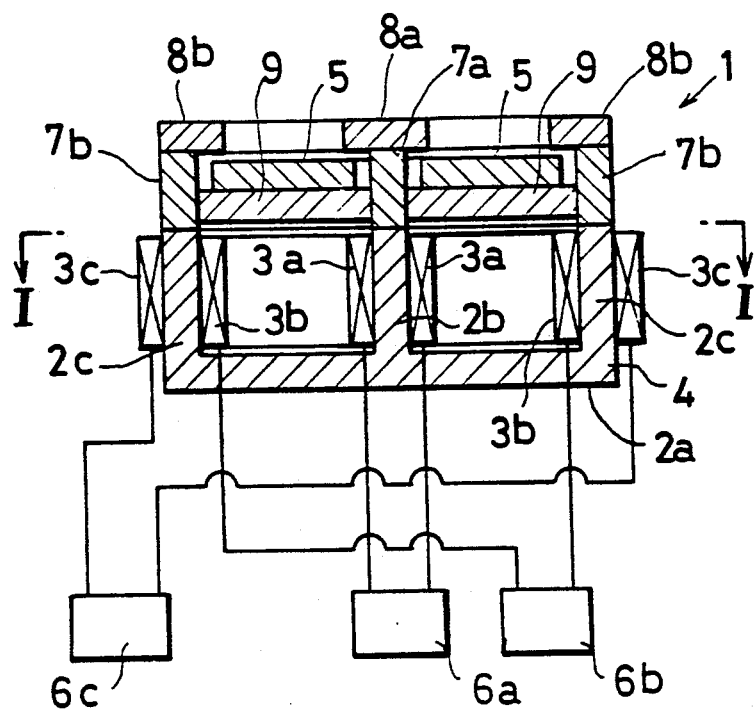
FIG. 1 is a sectional side view of the magnetron sputtering source of the instant invention.
Figure 2:
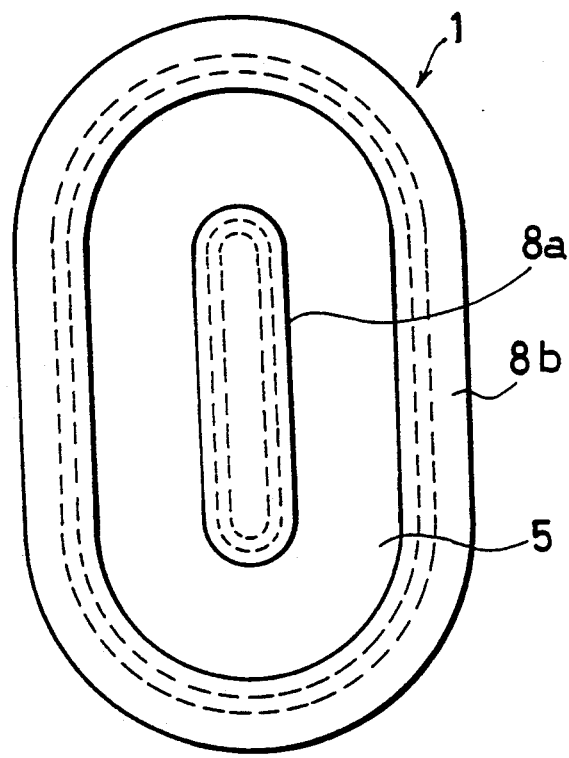
FIG. 2 is a plan view of the magnetron source shown in FIG. 1.
Figure 11:
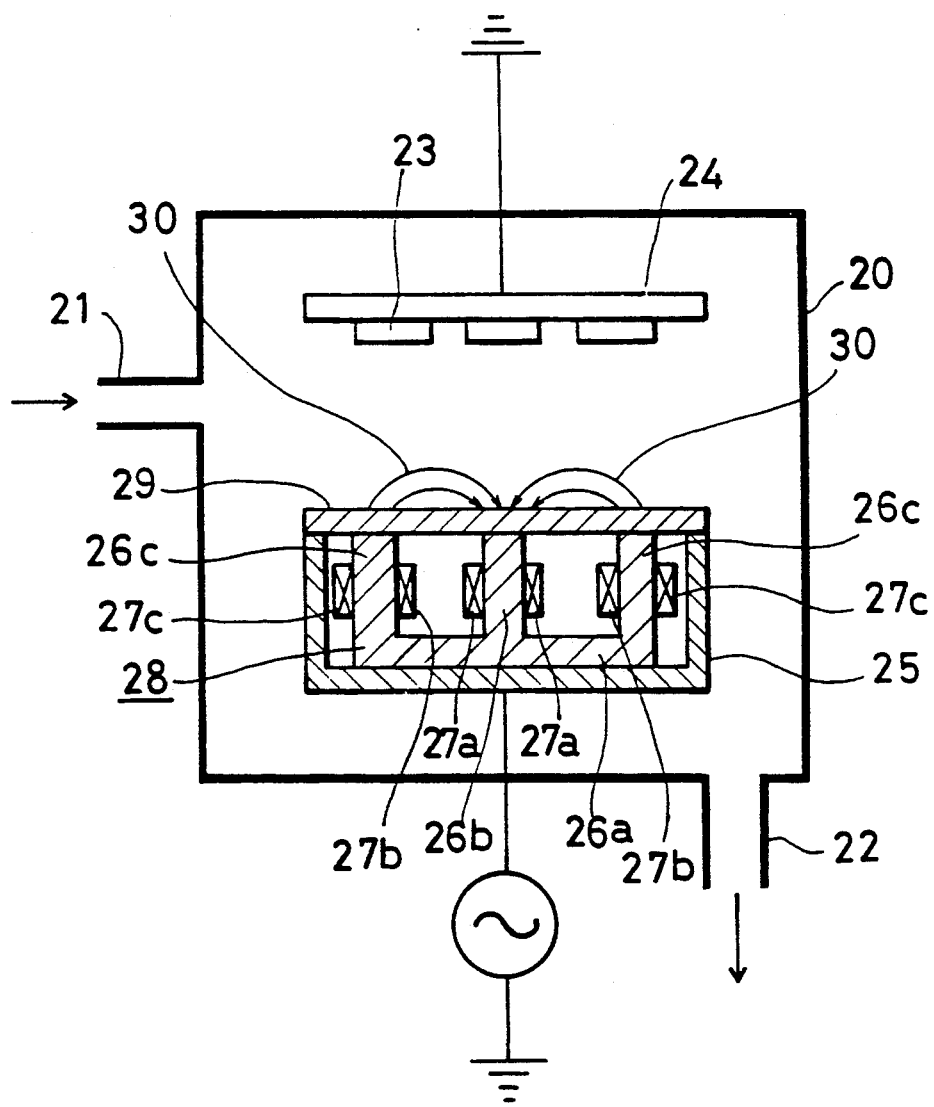
FIG. 11 is a sectional side view of a conventional magnetron sputtering apparatus.

In FIGS. 1 and 2 there is shown a magnetron sputtering source to be used in an embodiment of this invention. The magnetron sputtering source 1 shown in these figures is placed in a vacuum chamber in the same manner as the conventional example shown in FIG. 11, and is disposed inside thereof opposite to an anode on which substrates are mounted. The magnetron sputtering source 1 has an electromagnet 4 disposed in the rear of a target 5 which is an elliptically-shaped cathode plate and which is made of a magnetic or non-magnetic material. The electromagnet 4 comprises an island-like central yoke 2b projecting upwards from a central portion of elliptically-shaped bottom yoke plate 2a; a circularly-shaped rampart-type peripheral yoke 2c projecting upwards from the periphery of said bottom yoke 2a; a central coil 3a wound around said central yoke 2b in the circumferential direction thereof; an inner peripheral coil 3b wound around the inner periphery of said peripheral yoke 2c in the circumferential direction thereof on the side of said central yoke 2b; and an outer peripheral coil 3c wound around the outer periphery of said peripheral yoke 2c in the circumferential direction thereof.

DC or AC power sources 6a, 6b, 6c are connected to the central coil 3a, the inner peripheral coil 3b and the outer peripheral coil 3c, respectively. Further, a central projecting yoke 7a and a peripheral projecting yoke 7b, both being made of a ferromagnetic material, extend from the front ends of the central yoke 2b and the peripheral yoke 2c, respectively. At each of the front ends of the central yoke 7a and of the peripheral projecting yoke 7b, there are further provided a central pole piece 8a and a peripheral piece 8b, both being made of a ferromagnetic material. Thus, this structural arrangement allows the lines of magnetic force generated in the central yoke 2b and the peripheral yoke 2c by electric current flow through the coils to be guided to the center pole piece 8a and the peripheral pole piece 8b, both projecting the surface of the target 5, so that the magnetic field is formed in the neighborhood of the surface of the target 5.

The construction of the central projecting yoke 7a, the peripheral projecting yoke 7b, the central pole piece 8a and the peripheral pole piece 8b is shown in the Japanese Patent Application No. 11072/Heisei 1 (1989).

Constant values of direct current of 100A are supplied from the power sources 6a, 6b of 2.5 kw (100A×25 V) to the central coil 3a and the inner peripheral coil 3b while controlling the directions of the electric current flowing through the central coil 3a and the inner peripheral coil 3b to be in the same direction. A constant value of direct current of 100A is supplied from the power source 6c of 2.5 kw to the outer peripheral coil 3c while controlling the direction of the electric current therethrough to be periodically alternating (above 5 Hz but below 10 Hz) so as to flow in the same direction as, and in the opposite direction to, the current flowing through the central coil 3a and the inner peripheral coil 3b. Then, in a space between the central pole piece 8a and the peripheral pole piece 8b, a magnetic field having lines of magnetic force which are substantially parallel to the surface of the target 5 is formed near the surface. A spot wherein a strong magnetic field exists moves reciprocally between the part nearer the center and the part nearer the periphery each time the direction of the electric current through the outer peripheral coil 3c is alternated. Therefore, the spot with a strong magnetic field, and correspondingly the plasma to be generated in the spot in which the lines of magnetic force become parallel to the surface of the target 5, move in accordance with the movement of the magnetic field. As a result, the area or the target to be sputtered by the ions in the plasma becomes wider.

Further, in this case, if an electric current in which the value of the electric current varies (e.g. between 60A and 80A) and the direction of the electric current varies (i.e., an alternating current whose waveform is a triangular wave, sinusoidal wave, trapezoidal wave or the like) is supplied from the power source 6c to the outer peripheral coil 3c, control becomes easy.

A concrete method of controlling the electromagnet 4 in sputtering the ferromagnetic target 5 is as follows.

Control Method 1

Figure 3:
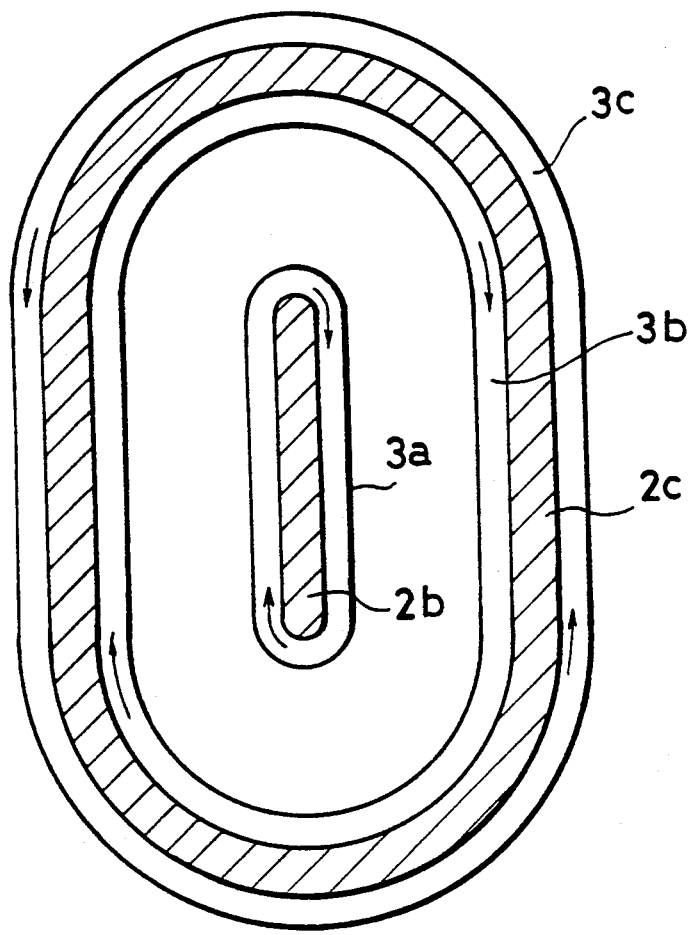
FIG. 3 is a sectional plan view along the line I—I of FIG. 1 showing the conditions when the directions of the electric currents flowing through a central coil and an inner peripheral coil are both made clockwise, while the direction of the electric current flowing through an outer peripheral coil is made counterclockwise.
Figure 4:
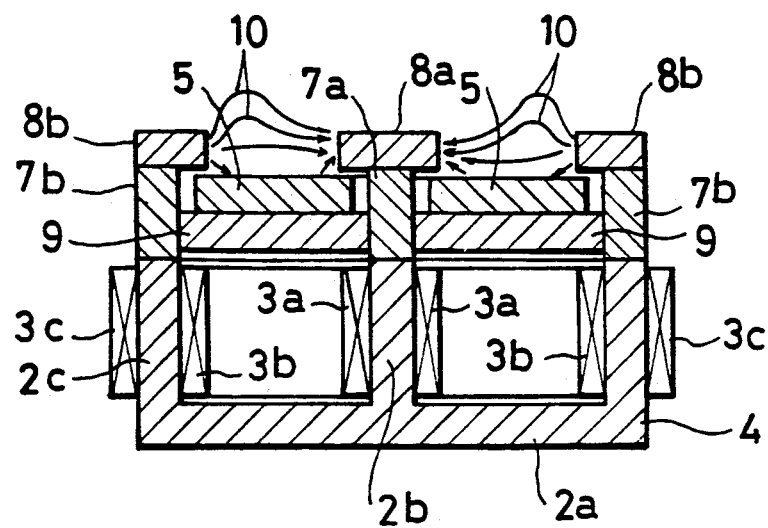
FIG. 4 is a sectional side view of the magnetron sputtering source shown in FIG. 3 showing the conditions of the magnetic field.

(a) As shown in FIG. 3, direct current is supplied from the power sources 6a, 6b to the central coil 3a and the inner peripheral coil 3b such that the directions of the electric currents flowing therethrough both become clockwise, while a constant value of direct current is supplied from the power source 6c to the outer peripheral coil 3c in the counterclockwise direction. By this operation, in the neighborhood of the surface of the target 5, lines 10 of magnetic force are generated which, as shown in FIG. 4, are directed from the peripheral pole piece 8b towards the central pole piece 8a. The strength of the magnetic field becomes weak in a space near the central pole piece 8a and strong in a space near the peripheral pole piece 8b. When sputtering is performed under these conditions, a plasma of high density is generated in that space near the central pole piece 8a in which the strength of the magnetic field is weak. As a result, the target 5 in that portion is largely eroded by sputtering.

Figure 5:
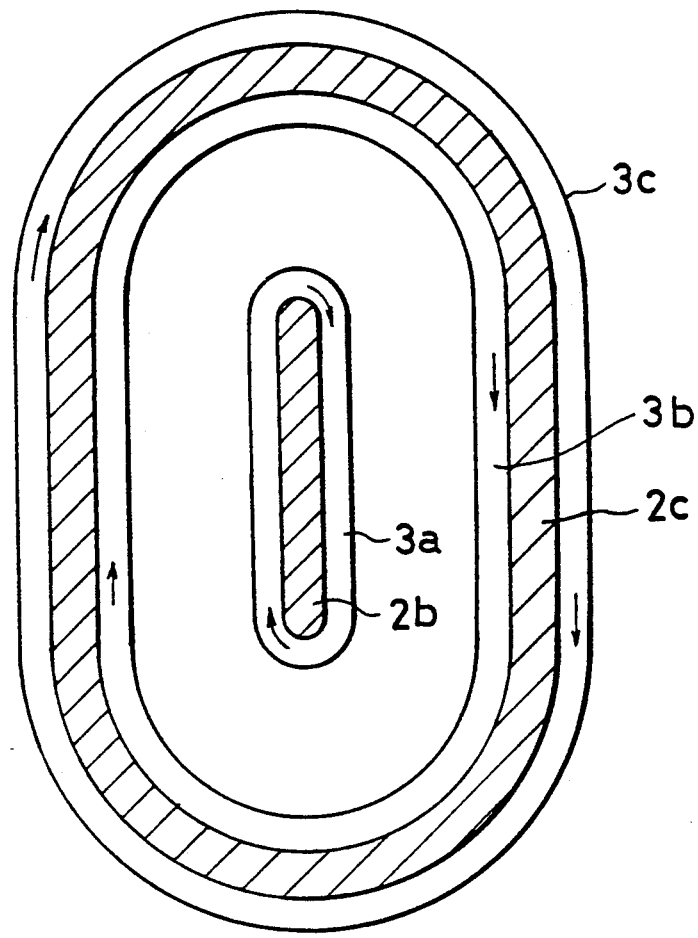
FIG. 5 is a sectional plan view taken along the line I—I of FIG. 1 showing the conditions when the directions of the electric currents flowing through the central coil and the inner peripheral coil are both made clockwise, while the direction of the electric current flowing through the outer peripheral coil is also made clockwise.
Figure 6:
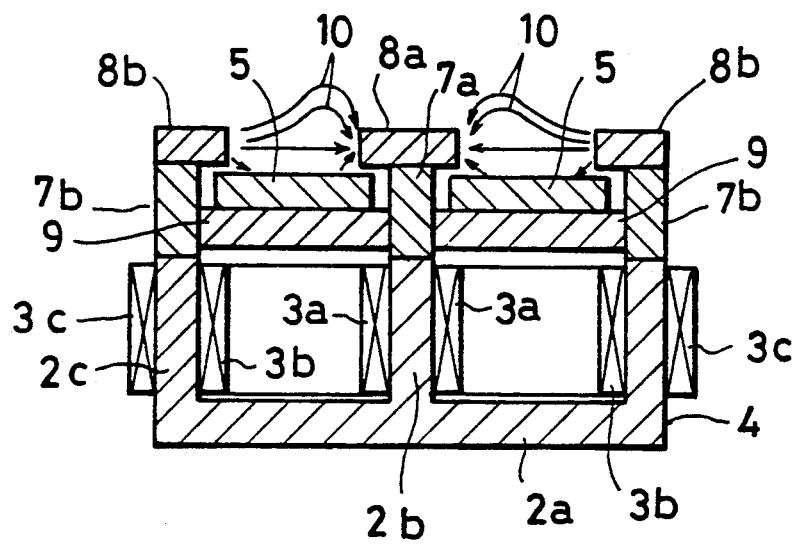
FIG. 6 is a sectional view of the magnetron sputtering source shown in FIG. 5 showing the conditions of the magnetic field.

(b) Next, from the conditions described in paragraph (a) above, when only the direction or the electric current flowing through the outer peripheral coil 3c is changed to the clockwise direction as shown in FIG. 5, the strength of the magnetic field is increased, contrary to the case in paragraph (a), in a space near the central pole piece 8a and decreased in a space near the peripheral pole piece 8b, as shown in FIG. 6. The direction of the lines 10 of magnetic force in this case does not change. When sputtering is performed under these conditions, a plasma of high density is generated in that space near the peripheral pole piece 8b in which the magnetic field is weak. The target 5 in that portion thereof is thus largely sputtered and eroded. Therefore, this control results in the target 5 being eroded at two portions and, as compared with the conventional control in which the strength of the magnetic force is kept stationary, the efficiency of utilization of the target 5 is improved from 25% in a conventional method to 40-50%.

Control Method 2

Figure 7:
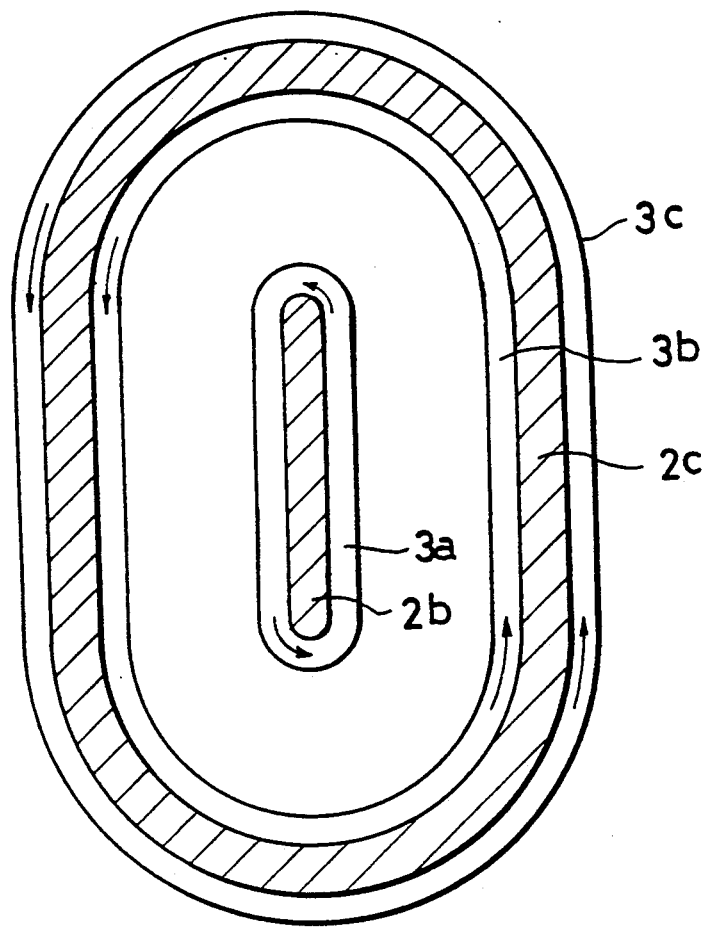
FIG. 7 is a sectional plan view along the line I—I of FIG. 1 showing the conditions when the directions of the electric currents flowing through the coil and the inner peripheral coil are both made counterclockwise, while the direction of the electric current flowing the outer peripheral coil is also made counterclockwise.
Figure 8:
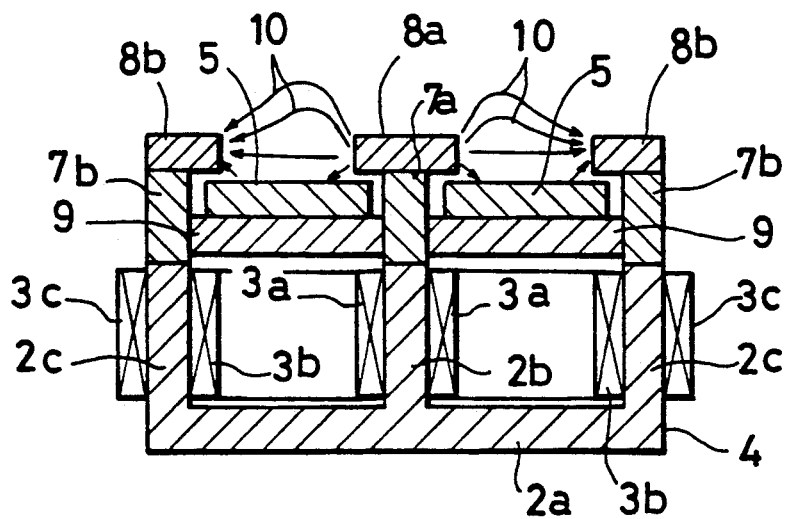
FIG. 8 is a sectional side view the magnetron sputtering source shown in FIG. 7 showing the of the magnetic field.

(a) As shown in FIG. 7, a constant value of direct current is supplied from the power sources 6a, 6b such that the directions of the electric currents flowing through the central coil 3a and the inner peripheral coil 3b are both made counterclockwise, and a constant value of electric current is made to flow through the outer peripheral coil 3c also in the counterclockwise direction. By this operation, as shown in FIG. 8, the lines 10 of magnetic force are directed from the central pole piece 8a towards the peripheral pole piece 8b, and the strength of the magnetic field becomes strong in a space near the central pole piece 8a and weak in a space near the peripheral pole piece 8b. When, sputtering is performed under these conditions, the portion of the target 5 near the peripheral pole piece 8b is largely eroded by sputtering.

Figure 9:
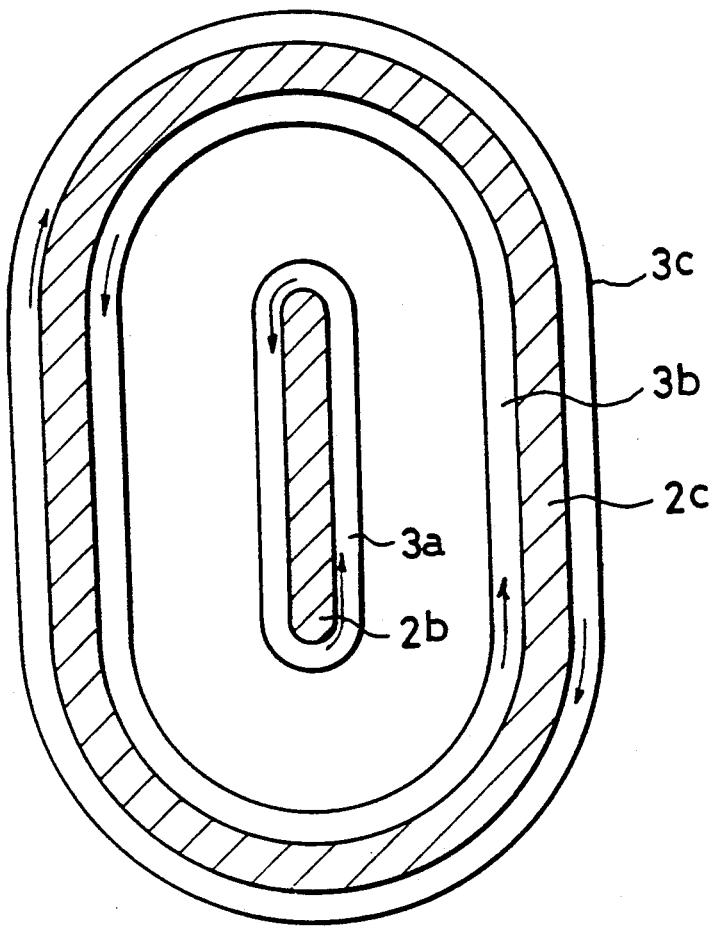
FIG. 9 is a sectional plan view taken along the line I—I of FIG. 1 showing the conditions when the directions of the electric currents flowing through the central coil and the inner peripheral coil are both made counterclockwise, while the direction of the electric current flowing through the outer peripheral coil is made clockwise.
Figure 10:
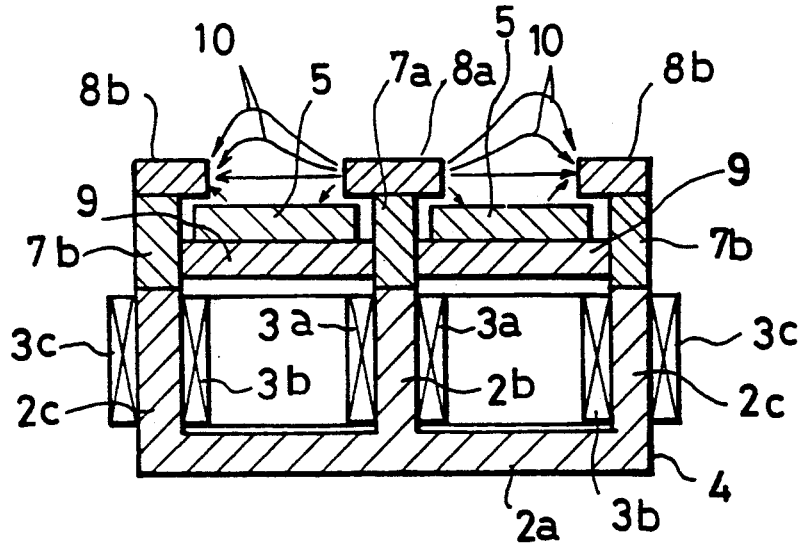
FIG. 10 is a sectional side view of the magnetron sputtering source shown in FIG. 9 showing the conditions of the magnetic field.

(b) Then, if the direction of the electric current flowing through the outer peripheral coil 3c is changed from the conditions of paragraph (a) above, to the clockwise direction as shown in FIG. 9, the strength of the magnetic field decreases, contrary to the case in paragraph (a), in a space near the central pole piece 8a and increases in a space near the peripheral pole piece 8b as shown in FIG. 10. In this case the direction of the lines 10 of magnetic force is the same as that in FIG. 8. When sputtering is performed under these conditions, the portion of the target 5 near the peripheral pole piece 8b is largely eroded by sputtering. Therefore, this control results in the target 5 being eroded in two portions and, as compared with the conventional control in which the strength of the magnetic force is kept stationary, the efficiency of utilization of the target 5 is improved from 30% in a conventional method to 40-50%.

Control Method 3

In the above control methods 1 and 2, the electric current is supplied to the outer peripheral coil 3c while controlling the direction of the electric current therethrough to periodically change to the opposite direction and, at the same time, the value of the electric current is varied between large and small values. By this control, the strength of the magnetic field to be generated by the outer peripheral coil 3c varies between strong and weak. As a result of the correlation of the magnetic fields of the central coil 3a with the inner peripheral coil 3b, the magnetic field which increases its strength in the neighborhood of the central pole piece 8a or the peripheral pole piece 8b fluctuates towards the central pole piece 8a or the peripheral pole piece 8b. Consequently, those two portions of the target 5 which are to be eroded by sputtering in the above control methods 1 and 2, are enlarged. Therefore, in the case of this control method 3, the efficiency of utilization of the target 5 is higher (e.g., about 60%) than those in either methods 1 and 2.

Although in the above control methods explanation has been made of the cases where direct currents are supplied by the power sources 6a, 6b, 6c, it is possible to use alternating current power sources if an apparatus to control the directions of the electric currents is used. Further, if the direction of the electric current flowing through the outer peripheral coil 3c is constant and only the value of the electric current is varied between large and small (e.g., between 0 and 100A), the spot with a strong magnetic field can be reciprocated within some range between the central pole piece 8a and the peripheral pole piece 8b. It is, however, difficult to largely improve the efficiency of utilization of the target 5. Further, in the above embodiment, explanation has been made of a magnetron sputtering source 1 comprising yokes 7a, 7b which project above the surface of the target 5 through the backing plate 9. The method of this invention can, however, be applied to the sputtering source shown in FIG. 11.

Although a specific embodiment of the instant invention has been described above and illustrated in the accompanying drawings in order to be more clearly understood, the above description is an example and not a limitation to the scope of the instant invention. It is contemplated that various modifications apparent to one of ordinary skill in the art could be made without departing from the scope of the invention which is to be determined by the following claims.

I claim:

1. A device for magnetron sputtering, having an electromagnet disposed on a rear surface of a target, said device comprising:
   a bottom yoke;
   a central yoke projecting upwards from a central portion of said bottom yoke;
   a circular peripheral yoke projecting upwards from the periphery of said bottom yoke, said central yoke and said circular peripheral yoke both projecting upwards above a top surface of the target;
   a central coil wound around said central yoke in a circumferential direction thereof;
   an inner peripheral coil wound around an inner periphery of said peripheral yoke in a circumferential direction thereof on a side of said central yoke;
   an outer peripheral coil wound around an outer periphery of said peripheral yoke in a circumferential direction thereof, whereby a magnetic field is formed in a space near a top surface of said target by electric current flowing through each of said coils;
   first control means for controlling the directions of electric currents flowing through said central coil and said inner peripheral coil so as to be identical with each other; and
   second control means for controlling the direction of an electric current flowing through said outer peripheral coil so as to alternatingly control the electric current to flow in the same direction as, and in the opposite direction to, the direction of the electric currents flowing through said central coil and said inner peripheral coil.

2. The device of claim 1, wherein said second control means further includes means controlling the amount of the electric current flowing through said outer peripheral coil so as to vary the value of the electric current between larger and smaller values.

3. The device according to claim 1, wherein the magnetic field is formed in a space near the top surface of said target substantially parallel to the top surface of said target.

4. A method of controlling an electromagnet disposed on a rear surface of a magnetron sputtering target, wherein the electromagnet includes a central yoke projecting upwards form a central portion of a bottom yoke, a generally circular peripheral yoke projecting upwards from the periphery of said bottom yoke, a central coil wound around the central yoke, an inner peripheral coil wound around the inner periphery of the peripheral yoke, and an outer peripheral coil wound around the outer periphery of the peripheral yoke, wherein the central yoke and peripheral yoke project upwards above a top surface of the target, said method comprising the steps of:
   flowing an electric current through the central coil;
   flowing an electric current through the inner peripheral coil;
   flowing an electric current through the outer peripheral coil such that the flow of electric current through each of the coils forms a magnetic field near the top surface of the magnetic sputtering target;
   controlling the directions of the electric current flowing through the central coil and of the electric current flowing through the inner peripheral coil such that the two directions are identical; and
   controlling the direction of the electric current flowing through the outer peripheral coil so as to alternatingly flow in the same direction as, and in opposite direction to, the direction of electric current flowing through the central coil and inner peripheral coil.

5. A method of controlling an electromagnet according to claim 4, wherein said step of controlling the direction of the electric current flow through the outer peripheral coil includes varying the values of the electric current between larger and smaller values.

6. A method for controlling an electromagnet according to claim 4, wherein the magnetic field is formed in a space near the top surface of the target substantially parallel to the top surface of the target.

* * * * *